US010142034B2

(12) United States Patent
Guillanneuf et al.

(10) Patent No.: US 10,142,034 B2
(45) Date of Patent: *Nov. 27, 2018

(54) OPTICALLY TRANSMISSIVE ELECTRONIC DEVICE HAVING AN OPTICALLY TRANSMISSIVE LIGHT EMITTING DEVICE TO TRANSMIT OPTICAL SIGNAL TO A SECOND OPTICALLY TRANSMISSIVE LIGHT RECEIVING DEVICE THROUGH A FIRST OPTICALLY TRANSMISSIVE LIGHT RECEIVING DEVICE

(71) Applicant: PHILIPS LIGHTING HOLDING B.V., Eindhoven (NL)

(72) Inventors: Frederic Alexandre Guillanneuf, Eindhoven (NL); Marcellinus Petrus Carolus Michael Krijn, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 77 days.

This patent is subject to a terminal disclaimer.

(21) Appl. No.: 14/916,113

(22) PCT Filed: Aug. 28, 2014

(86) PCT No.: PCT/EP2014/068203
§ 371 (c)(1),
(2) Date: Mar. 2, 2016

(87) PCT Pub. No.: WO2015/028528
PCT Pub. Date: Mar. 5, 2015

(65) Prior Publication Data
US 2016/0218814 A1   Jul. 28, 2016

(30) Foreign Application Priority Data
Sep. 2, 2013 (EP) ................... 13182578

(51) Int. Cl.
*H04B 10/80* (2013.01)
*G02B 6/43* (2006.01)
(Continued)

(52) U.S. Cl.
CPC .......... *H04B 10/801* (2013.01); *G01J 1/0271* (2013.01); *G01J 1/0407* (2013.01);
(Continued)

(58) Field of Classification Search
CPC . H01L 31/032; H01L 31/1136; H01L 25/167; G02B 6/4246; G02B 6/43;
(Continued)

(56) References Cited

U.S. PATENT DOCUMENTS 586,483 A    7/1897   Gauhe
4,549,206 A *  10/1985  Suzuki ................ G01N 21/956
                                              250/559.34
(Continued)

FOREIGN PATENT DOCUMENTS

CN    1524192 A    8/2004
CN    101681006 A  3/2010
(Continued)

OTHER PUBLICATIONS

Zhong Qiang Wang et al, "Synaptic Learning and Memory Functions Achieved Using Oxygen Ion Migration/Diffusion in an Amorphous InGaZnO Memristor", Advanced Functional Materials, Wiley-VCH Verlag GMBH & Co, KGAA, DE, vol. 22, No. 13, Jul. 10, 2012, pp. 2759-2765, XP-001576332.

*Primary Examiner* — Que T Le
(74) *Attorney, Agent, or Firm* — Akarsh P. Belagodu

(57) ABSTRACT

An electronic device (101, 200, 300, 400) is provided comprising optically transmissive electrical components (102, 103, 205-210, 303, 304, 405-410, 413-418) and optically transmissive computer structures such as boards (105,
(Continued)

201-203) or enclosures (302, 311-313). The components of the electronic device communicate through optical signals (212, 214, 309, 314, 422, 428) that propagate freely within the electronic device. That is, the optical signals are not guided and may or may not travel through the optically transmissive structures and components. This enables increased communication paths and reduced number of physical connections between various parts of the electronic device. The components may be placed in a single plane or in a three-dimensional layout and still communicate via the light signals. The invention enables an adaptable layout of an electronic device which is easily constructed.

13 Claims, 2 Drawing Sheets

(51) Int. Cl.
| | | |
|---|---|---|
| *G01J 1/02* | (2006.01) | |
| *G01J 1/04* | (2006.01) | |
| *H01L 25/16* | (2006.01) | |
| *H01L 31/032* | (2006.01) | |
| *H01L 31/113* | (2006.01) | |
| *H05K 1/02* | (2006.01) | |
| *H05K 1/14* | (2006.01) | |

(52) U.S. Cl.
CPC .............. *G02B 6/43* (2013.01); *H01L 25/165* (2013.01); *H01L 25/167* (2013.01); *H01L 31/032* (2013.01); *H01L 31/1136* (2013.01); *H05K 1/0274* (2013.01); *H05K 1/14* (2013.01); *H01L 2924/0002* (2013.01); *H05K 2201/10106* (2013.01); *H05K 2201/10121* (2013.01); *H05K 2201/10151* (2013.01)

(58) Field of Classification Search
CPC .... G01J 1/0271; G01J 1/0407; G06N 3/0675; H04B 10/2504; H04B 10/80; H04B 10/801; H05K 1/0274; H05K 1/14
USPC ...................................................... 250/214.1
See application file for complete search history.

(56) References Cited

U.S. PATENT DOCUMENTS

| | | | |
|---|---|---|---|
| 5,008,833 A | | 4/1991 | Agranat et al. |
| 5,063,531 A | | 11/1991 | Kawau et al. |
| 5,753,928 A | * | 5/1998 | Krause .................. H01L 31/173 |
| | | | 250/214.1 |
| 5,864,836 A | | 1/1999 | Balsi et al. |
| 6,754,646 B1 | | 6/2004 | Wang |
| 6,818,474 B2 | | 11/2004 | Kim et al. |
| 6,903,378 B2 | | 6/2005 | Cok |
| 7,276,858 B2 | | 10/2007 | Allen |
| 7,309,144 B2 | | 12/2007 | Foong et al. |
| 7,364,338 B2 | | 4/2008 | Chang |
| 7,462,873 B2 | | 12/2008 | Hoshi et al. |
| 8,014,681 B1 | | 9/2011 | Smits |
| 8,115,228 B2 | | 2/2012 | Peeters et al. |
| 8,207,752 B2 | | 6/2012 | Raj et al. |
| 8,258,310 B2 | | 9/2012 | Nomura et al. |
| 2002/0055200 A1 | | 5/2002 | Kondo et al. |
| 2002/0130817 A1 | | 9/2002 | Forster et al. |
| 2002/0185588 A1 | | 12/2002 | Wagner et al. |
| 2004/0107172 A1 | | 6/2004 | Wang |
| 2005/0014201 A1 | | 1/2005 | Deuthsch |
| 2005/0146270 A1 | | 7/2005 | Ho |
| 2012/0086345 A1 | | 4/2012 | Tran |
| 2016/0196489 A1 | * | 7/2016 | Guillanneuf ......... G06N 3/0675 |
| | | | 706/27 |

FOREIGN PATENT DOCUMENTS

| | | |
|---|---|---|
| DE | 10127017 | 12/2002 |
| EP | 0041668 | 12/1981 |
| EP | 0584669 | 10/1996 |
| EP | 2386890 | 11/2011 |
| EP | 2386891 | 11/2011 |
| FR | 2681710 | 9/1991 |
| WO | WO2003035824 | 5/2003 |
| WO | WO2004062138 | 7/2004 |
| WO | WO2004095105 | 11/2004 |
| WO | WO2005026964 | 3/2005 |
| WO | WO2007071210 | 6/2007 |
| WO | 2010050276 A1 | 5/2010 |

* cited by examiner

OPTICALLY TRANSMISSIVE ELECTRONIC DEVICE HAVING AN OPTICALLY TRANSMISSIVE LIGHT EMITTING DEVICE TO TRANSMIT OPTICAL SIGNAL TO A SECOND OPTICALLY TRANSMISSIVE LIGHT RECEIVING DEVICE THROUGH A FIRST OPTICALLY TRANSMISSIVE LIGHT RECEIVING DEVICE

CROSS-REFERENCE TO PRIOR APPLICATIONS

This application is the U.S. National Phase application under 35 U.S.C. § 371 of International Application No. PCT/EP2014/068203, filed on Aug. 28, 2014, which claims the benefit of European Patent Application No. 13182578.8, filed on Sep. 2, 2013. These applications are hereby incorporated by reference herein.

FIELD OF THE INVENTION

The present invention relates to electronic devices. In particular, the present invention relates to communication in electronic devices.

BACKGROUND OF THE INVENTION

In modern electronic devices, a large number of electronic components are electrically connected for communicating with each other. In some applications, discrete components are mounted on a printed circuit board (PCB) which comprises the required conductive paths for interconnecting the components. For more complex applications where a larger number of components are required, integrated circuits are used where components are made in a semiconductor substrate and where communication between components takes place in different metal layers arranged on the substrate.

With increasing complexity of both integrated circuits as well as of circuits comprising discrete components arranged on a PCB follows problems related to the communication between components. In an integrated circuit comprising millions of components, more and more conductive layers need to be used to achieve the required communication paths between different components. The addition of metal layers in integrated circuits leads both to a more complex manufacturing process and to problems associated with heat dissipation from components. Similarly, with an increasing number of discrete components on a PCB, the connection paths becomes more complex while the area of the PCB may be limited, which may in turn lead to limitations in functionality of the circuit.

Along with the increasing complexity of interconnects comes a decrease in size of the conductive paths as it is important to minimize the area which is taken up by electrical connections. However, as the size of the electrical connections is reduced the resistance increases which in turn leads to more heat generation and thereby to power losses in the circuit.

Furthermore, the demands on the performance, such as processing speed and power consumption, of electronic devices developed today are increasing and at the same time it is more and more important to reduce the size of the circuit for use in various portable devices. To keep up with the higher demands, the number of components in electronic devices therefore increases, which means the number of possible and required connections and contacts in the device grows rapidly and thus also the overall complexity of the circuit.

Accordingly, it is desirable to find new approaches for addressing the complexity and drawbacks that comes with communication between components of electronic circuits having an ever increasing complexity.

SUMMARY OF THE INVENTION

A general object of the present invention is to provide an electronic device provided with more flexible communication between components of the device.

According to a first aspect of the invention it is therefore provided an optically transmissive light-emitting device; and an optically transmissive light-receiving device; arranged such that an optical signal transmitted from said optically transmissive light-emitting device propagates unguided from said optically transmissive light-emitting device, is received by said light-receiving device, wherein a portion of said optical signal is transmitted through said optically transmissive light-receiving device.

An electronic device according to the invention is a device in which communication between various electrical components is required.

An optically transmissive component is a component that may allow for at least enough of an optical signal to pass through a material of the component such that the optical signal may accurately be received by the light-receiving device. Optically transmissive may be e.g. transparent, semi-transparent, translucent, or combinations thereof. The light-emitting device and the light-receiving device communicate via unguided propagation of optical signals. In other words, the optical signals are not guided from one device to another device but are emitted by the light-emitting device and may propagate freely through both optically transmissive materials and air.

The present invention is based on the realization that by using components made from optically transmissive materials, light-emitting devices arranged in the device may transmit optical signals in several directions which enable communication with more than one other light-receiving device. In such a device, the components arranged therein may communicate through optical signals which will not be obstructed by the optically transmissive components of the device. The invention enables flexibility in designing a structure and layout of an electronic device that is independent of the locations of the components within the device. Thus, a number of electrical connections between components of the device made via physical connections such as wires can be reduced, or even eliminated. Communication via unguided optical signals further eliminates the need for guiding the optical signal through e.g. an optical fiber, thus the complexity of the electronic device is reduced. By eliminating or reducing the need for physical connections between components the number of connections may be increased and thus the processing speed of the device may be increased with reduced complexity with respect to the number of interconnects. Thus, optical communication may replace conventional data-bus communication which enables increased communication speed.

According to one embodiment of the invention, the electronic device may further comprise a second optically transmissive light-receiving device wherein said optical signal is transmitted through said second optically transmissive light-receiving device. Thereby, a plurality of light-receiving devices may be arranged at nearly any location within the electronic device without preventing the optical signal from reaching each or any of the light-receiving devices. Thus, the light-receiving devices are optically transmissive such that the optical signal may at least partly be passed through a material of a light-receiving device. The optical signal may therefore reach the second optically transmissive device independent of location of the light-receiving devices which facilitates an increased number of available arrangements of light-receiving devices.

In one embodiment of the invention, the electronic device may further comprise an optically transmissive substrate comprising the optically transmissive light-receiving device, wherein the optical signal propagates unguided within the substrate. Arranging an integrated optically transmissive light-receiving device in an optically transmissive substrate enables the optical signal to propagate without being blocked by the substrate. The optically transmissive substrate enables further a reduction of the required number of electrical connections between devices within the substrate. Furthermore, it enables optical signals to be received by light-receiving devices from an increased number of directions since the optical signal may pass through the substrate.

Furthermore, the optically transmissive light-receiving device may advantageously be configured to receive optical signals reaching the light-receiving device from all directions, i.e. a receiver may be entirely made from optically transmissive materials.

According to one embodiment of the invention, the light-emitting device may be optically transmissive and configured to emit optical signals in all directions. In this way, it allows for communication between a plurality of light-emitting and light-receiving devices which are all optically transmissive arranged anywhere within the electronic device to communicate. For example, an optical signal may pass through a material of the optically transmissive light-emitting device which enables further layout possibilities of light-emitting devices within the electronic device.

According to one embodiment of the invention, the electronic device may further comprise an optically transmissive circuit board (105, 201-203), wherein said light-receiving device is arranged on said optically transmissive circuit board, and wherein said optical signal is transmitted through said optically transmissive circuit board. Thereby, communication through the circuit board using optical signals is enabled, thus communication possibilities are improved. Furthermore, a more visually appealing appearance for a user is possible since it may be possible to obtain a nearly transparent appearance of the entire or at least parts of the electronic device.

According to one embodiment of the invention, the light-emitting device may be arranged on a second optically transmissive circuit board. In this way, high speed wireless communication between circuit boards or between different devices adjacent to each other is enabled.

According to one embodiment of the invention, a plurality of electronic devices may each be arranged in a respective optically transmissive enclosure, wherein the electronic devices are further arranged adjacent to each other in an optically transmissive housing. The optically transmissive enclosure is advantageously a spherical enclosure. The plurality of electronic devices may be arranged separate from each other at a distance.

According to one embodiment of the invention, the light-receiving device may advantageously be a solid state phototransistor or photodiode. The light-emitting device may advantageously be a solid state lighting device, in which light is generated through recombination of electrons and holes. Such light-emitting device may advantageously be a light-emitting diode. The optically transmissive light-receiving device is advantageously made from indium-gallium-zinc-oxide. However, the optically transmissive light-receiving device may be made from any other suitable material. Furthermore, the optically transmissive circuit boards may be made from plastic or glass. Additionally, the optical signal may be a light signal comprising a wavelength in any appropriate wavelength interval such as e.g. microwave, infrared, visible, ultraviolet, etc.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing exemplary embodiments of the invention, wherein.

DESCRIPTION OF EXAMPLE EMBODIMENTS OF THE PRESENT INVENTION

In the following description, the present invention is described with reference to example applications. It should, however, be noted that this by no means limits the scope of the invention, which is equally applicable to other applications, such as light equipments, LED lamps, coded light luminaires, mobile phones, watches, heads-up displays, television sets, displays, and games.

Figure 1:
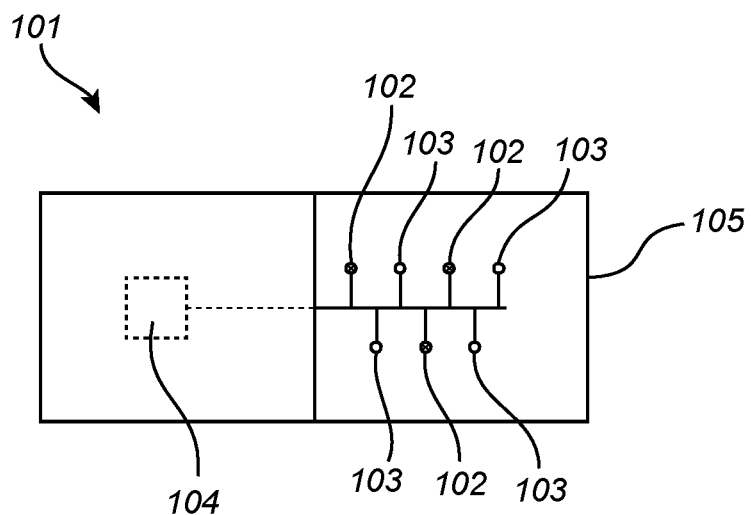
FIG. 1 illustrates an electronic device according to an embodiment of the invention comprising a single circuit board.

FIG. 1 illustrates an exemplary embodiment of an electronic device 101 in accordance with the invention in the form of a computer bus 101. FIG. 1 shows a circuit board 105, a processing unit 104, a plurality of light-emitting devices 102, and a plurality of optically transmissive light-receiving device 103. The light-receiving devices 103 are optically transmissive and are arranged on the circuit board 105 which also is optically transmissive. The light emitting devices 102 are also arranged on the circuit board 105. The light-emitting devices 102 communicate with the light-receiving devices 103 by emitting optical signals which may be received by at least one of the light-receiving devices 103. In the illustrated embodiment in FIG. 1, an optical signal may propagate unguided from the light-emitting devices 102 to at least one of the light-receiving devices 103 and may propagate through and/or within an optically transmissive component, in this case the optically transmissive circuit board 105. The light-emitting devices 102 are advantageously light-emitting diodes and the light-receiving devices 103 are advantageously photodiodes or phototransistors. The light-emitting devices 102 may in some embodiments be optically transmissive.

Figure 2:
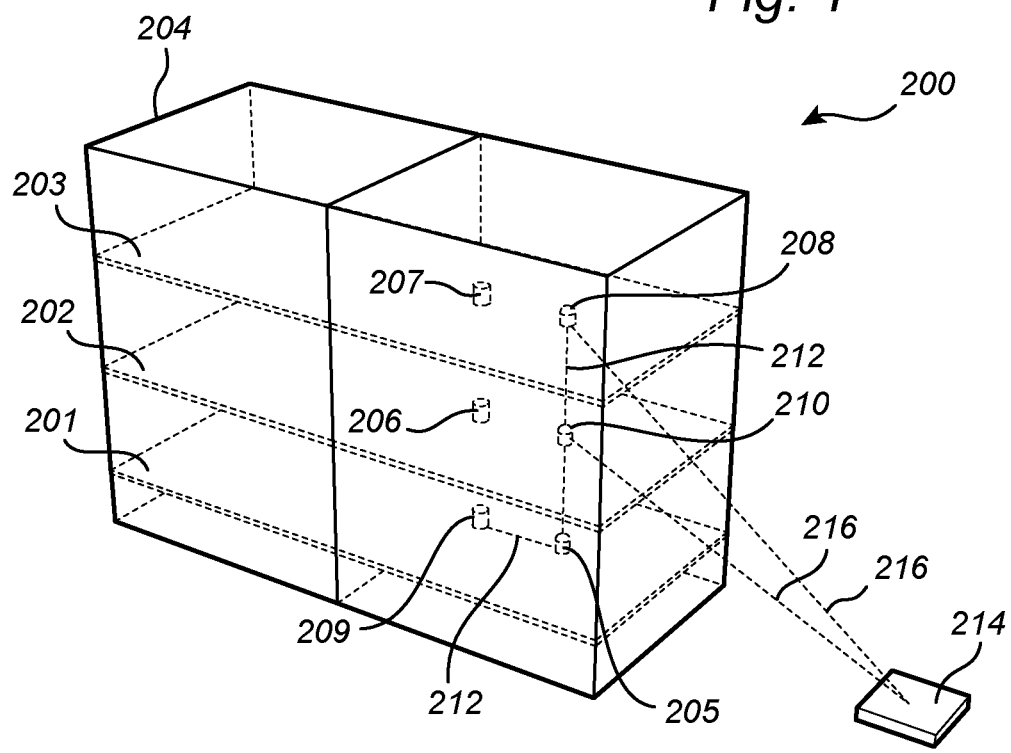
FIG. 2 illustrates an electronic device according to an embodiment of the invention comprising several circuit boards.

FIG. 2 illustrates an exemplary embodiment of the invention where several circuit boards 201-203 are stacked above each other in a housing 204. The circuit boards 201-203 each comprise a respective light-emitting device 205-207 and a light-receiving device 208-210. The circuit boards 201-203, and the light-receiving devices 208-210, are optically transmissive. As illustrated in FIG. 2, an optical signal 212 emitted by the light-emitting device 205 arranged on the bottom board 201 may propagate unguided through the optically transmissive board 202, and through the optically transmissive light-receiving device 210 to be received by the light-receiving device 208 arranged on circuit board 203. The optical signal 212 emitted by the light-emitting device 205 is emitted in all directions. The optical signal 212 therefore also reaches the light-receiving device 209 arranged on board 201. This way, communication is enabled in more than one direction, that is, light-receiving devices arranged on the same board 201 as the light-emitting device 205 or light-receiving devices arranged on boards arranged e.g. above or below the board 201 of the light-emitting device 205 may receive the emitted optical signal 212. The light-emitting devices 205-207 may be optically transmissive. In such case the optical signal 212 emitted by the light-emitting device 205 is emitted in all directions. With further reference to FIG. 2, each of the light-emitting devices 205-207 and light-receiving devices 208-210 may be connected to respective integrated circuits enabling wireless communication between integrated circuits arranged on different circuit boards 201-203.

Still with reference to FIG. 2, an alternative embodiment of an electronic device 200 may comprise a light-emitting device 214 arranged external to the housing 204. In this embodiment, the housing 204 is optically transmissive. The external light-emitting device 214 may emit an optical signal 216 that is received by at least one of the optically transmissive light-receiving devices 208-210 arranged on a respective optically transmissive circuit board 201-203. The optical signal propagates unguided from the external light-emitting device 214 to at least one of the light-receiving devices 208-210. Broadcasting functionality is enabled with the embodiment having the external light-emitting device 214 transmitting the optical signal 216 to several light-receiving devices 208-210.

Figure 3:
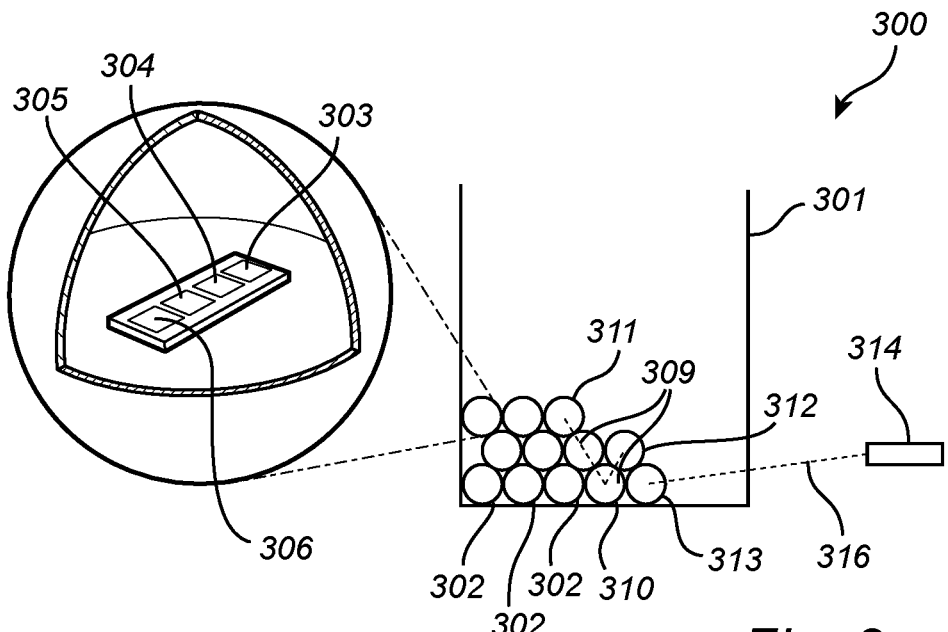
FIG. 3 illustrates an electronic device according to an embodiment of the invention.

FIG. 3 illustrates another embodiment of an electronic device 300 according to the invention where a plurality of optically transmissive spherical structures 302 is located in a transparent housing 301. Each of the spherical structures 302 comprises a light-emitting device 303, an optically transmissive light-receiving device 304, an optically transmissive processing unit 305, and an optically transmissive battery 306. The structure 302 may be made from an optically transmissive plastic. The optically transmissive spherical structures 302 may be randomly arranged in the container 301, still enabling an optical signal to propagate unguided from a light-emitting device to a light-receiving device arranged in different spherical structures. For example, as shown in FIG. 3, an optical signal 309 emitted by a light-emitting device arranged in spherical structure 310 is received by a light-receiving device arranged in a remote spherical structure 311. The light signal is emitted in all directions, the light may therefore also reach other light-receiving devices arranged in other spherical structures, for example a light-receiving device arranged in a remote spherical structure 312. The light-emitting device 303 may be optically transmissive in some embodiments. Furthermore, the spherical structures 302 may in principle have any shape, such as ellipsoidal, cubic, or a freeform shape. The embodiment illustrated in FIG. 3 may be used for e.g. intelligent coded light luminaires, or for high-capacity parallel computing applications.

Still with reference to FIG. 3, an alternative embodiment may comprise a light-emitting device 314 arranged external to the transparent housing 301. The external light-emitting device 314 may emit an optical signal 316 that is received by at least one optically transmissive light-receiving device arranged in e.g. the optically transmissive sphere 313. The optical signal propagates unguided from the external light-emitting device 314 to the light-receiving device of spherical structure 313, or any of the other light-receiving devices arranged in any of the optically transmissive spheres 302. The embodiment in FIG. 3 may be used in a broadcasting functionality having an external light-emitting device 314 communicating with several light-receiving devices.

Figure 4:
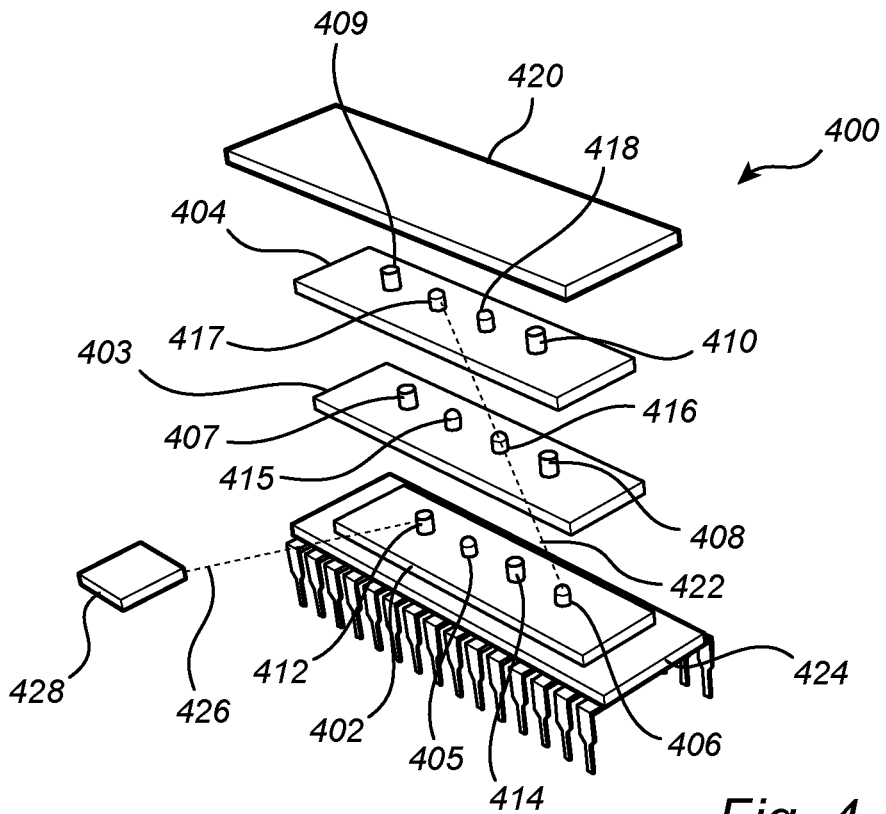
FIG. 4 illustrates an exploded view of an electronic device according to an embodiment of the invention.

FIG. 4 illustrates an exemplary embodiment of an electronic device 400 according to the invention in the form of an integrated circuit 400. The integrated circuit comprises several layers 402-404 of optically transmissive material, each layer comprising respective light-emitting devices 405-410 and optically transmissive light-receiving devices 413-418. A casing 420 encloses the integrated circuit 400. Communication within the integrated circuit 400 is enabled by transmission of an optical signal 422 from, for example, the light-emitting device 406 in layer 402 to the light-receiving device 417 in layer 404. In FIG. 4, the optical signal 422 emitted by the light-emitting device 406 propagates unguided through optically transmissive components in the form of the optically transmissive layer 403, and the optically transmissive light-receiving device 416 to be received by the light-receiving device 417 arranged in layer 404. In some embodiments, the casing 420 and a substrate 424 are optically transmissive which enables optical signals 426 emitted by an external light-emitting device to be received by a light-receiving device 413 (or any of the other light-receiving devices 413-418) of the integrated circuit 400. Additionally, variations to the disclosed embodiments can be understood and effected by the skilled person in practicing the claimed invention, from a study of the drawings, the disclosure, and the appended claims. For example, an optically transmissive component may be any of the light-receiving devices, light-emitting devices, circuit boards, substrates, etc though which an optical signal may propagate.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Summarizing, an electronic device 101, 200, 300, 400 is provided comprising optically transmissive electrical components 102, 103, 205-210, 303, 304, 405-410, 413-418 and optically transmissive computer structures such as boards 105, 201-203 or enclosures 302, 311-313. The components of the electronic device communicate through optical signals 212, 214, 309, 314, 422, 428 that propagate freely within the electronic device. That is, the optical signals are not guided and may or may not travel through the optically transmissive structures and components. This enables increased communication paths and reduced number of physical connections between various parts of the electronic device. The components may be placed in a single plane or in a three-dimensional layout and still communicate via the light signals. The invention enables an adaptable layout of an electronic device which is easily constructed.

The invention claimed is:

1. An electronic device comprising:
   an optically transmissive light-emitting device;
   first optically transmissive light-receiving device;
   a second optically transmissive light-receiving device; and
   arranged such that an optical signal transmitted from said light-emitting device propagates unguided from said light-emitting device, and is received by said first light-receiving device,
   wherein said optically transmissive light-emitting device is configured to transmit said optical signal such that a portion of said optical signal is transmitted to said second optically transmissive light-receiving device through said first optically transmissive light-receiving device.

2. The device according to claim 1, further comprising an optically transmissive substrate comprising said optically transmissive light-receiving device, wherein said optical signal propagates unguided within said substrate.

3. The device according to claim 1, further comprising an optically transmissive substrate and wherein said light-emitting device and said light-receiving device are formed in said optically transmissive substrate such that said optical signal propagates unguided within said substrate.

4. The device according to claim 1, wherein said optically transmissive light-receiving device is configured to receive optical signals reaching said light-receiving device from all directions.

5. The device according to claim 1, wherein said light-emitting device is optically transmissive and configured to emit optical signals in all directions.

6. The device according to claim 1, further arranged and configured such that said light-emitting device is arranged separate and at a distance from said light-receiving device.

7. The device according to claim 1, further comprising an optically transmissive circuit board, wherein said optically transmissive light-receiving device is arranged on said optically transmissive circuit board, and wherein said optical signal is transmitted through said optically transmissive circuit board.

8. The device according to claim 7, wherein said light-emitting device is arranged on a second optically transmissive circuit board.

9. A system comprising a plurality of electronic devices according to claim 5, wherein each of the plurality of electronic devices being arranged in a respective optically transmissive enclosure, said plurality of electronic devices further being arranged adjacent to each other in an optically transmissive housing.

10. The plurality of electronic devices according to claim 9, wherein said optically transmissive enclosure is spherical.

11. The device according to claim 1, wherein said optically transmissive light-receiving device is made from indium-gallium-zinc-oxide.

12. The device according to claim 1, wherein said light-emitting device is a solid state light emitting device.

13. The device according to claim 1, wherein said light-receiving device is a solid-state phototransistor or photodiode.

* * * * *